United States Patent
Uzoh

(10) Patent No.: US 12,087,629 B2
(45) Date of Patent: Sep. 10, 2024

(54) THROUGH-DIELECTRIC-VIAS (TDVs) FOR 3D INTEGRATED CIRCUITS IN SILICON

(71) Applicant: Adeia Semiconductor Technologies LLC, San Jose, CA (US)

(72) Inventor: Cyprian Emeka Uzoh, San Jose, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 962 days.

(21) Appl. No.: 15/157,197

(22) Filed: May 17, 2016

(65) Prior Publication Data

US 2016/0343613 A1    Nov. 24, 2016

Related U.S. Application Data

(60) Provisional application No. 62/162,813, filed on May 18, 2015.

(51) Int. Cl.
*H01L 21/768* (2006.01)
*H01L 23/48* (2006.01)
(Continued)

(52) U.S. Cl.
CPC ...... *H01L 21/76898* (2013.01); *H01L 23/481* (2013.01); *H01L 25/0657* (2013.01);
(Continued)

(58) Field of Classification Search
CPC ......... H01L 21/76898; H01L 21/76802; H01L 21/4846; H01L 21/486; H01L 21/8221;
(Continued)

(56) References Cited

U.S. PATENT DOCUMENTS 9,167,710 B2    10/2015  Mohammed et al.
9,685,394 B2 *   6/2017  Sekine .............. H01L 21/76898
(Continued)

OTHER PUBLICATIONS

Cho, Yong-Soo, and Sie-Young Choi. "SOI CMOS image sensor with pinned photodiode on handle wafer." J. Kor. Sensors Soc 15.5 (2006): 341-346.
(Continued)

*Primary Examiner* — Shaun M Campbell
*Assistant Examiner* — Aneta B Cieslewicz
(74) *Attorney, Agent, or Firm* — HALEY GUILIANO LLP

(57) ABSTRACT

Through-dielectric-vias (TDVs) for 3D integrated circuits in silicon are provided. Example structures and processes fabricate conductive vertical pillars for an integrated circuit assembly in a volume of dielectric material instead of in silicon. For example, a block of a silicon substrate may be removed and replaced with dielectric material, and then a plurality of the conductive pillars can be fabricated through the dielectric block. The through-dielectric-vias are shielded from devices and from each other by an intervening thickness of the dielectric sufficient to reduce noise, signal coupling, and frequency losses. The through-dielectric-vias can provide improved stress management and reduced keep-out-zones, reduced via-to-via and via-to-device coupling because of relatively large dielectric spacing and low-k dielectrics that can be used, reduced parasitic capacitance, faster switching speeds, lower heat dissipation requirements, lower production costs, easy miniaturization that is scalable to large assemblies and interposers, and high performance stacked assemblies.

22 Claims, 19 Drawing Sheets

(51) Int. Cl.
*H01L 23/532* (2006.01)
*H01L 25/00* (2006.01)
*H01L 25/065* (2023.01)

(52) U.S. Cl.
CPC .......... *H01L 25/50* (2013.01); *H01L 23/5329* (2013.01); *H01L 2225/06544* (2013.01)

(58) Field of Classification Search
CPC ............. H01L 23/481; H01L 23/49827; H01L 23/5329; H01L 23/5226; H01L 2225/06541; H01L 2225/06544; H01L 2225/06548; H01L 25/0657; H01L 25/50; H01L 27/0688; H01L 2224/08145
See application file for complete search history.

(56) References Cited

U.S. PATENT DOCUMENTS

| | | | |
|---|---|---|---|
| 10,460,958 B2 | 10/2019 | Mohammed et al. | |
| 2002/0027293 A1* | 3/2002 | Hoshino | H01L 21/76898 257/774 |
| 2004/0259292 A1* | 12/2004 | Beyne | H01L 21/76898 438/125 |
| 2006/0040471 A1* | 2/2006 | Ramanathan | H01L 25/50 438/459 |
| 2006/0118965 A1* | 6/2006 | Matsui | H01L 23/481 257/774 |
| 2008/0079121 A1* | 4/2008 | Han | H01L 21/76898 257/621 |
| 2008/0272465 A1* | 11/2008 | Do | H01L 25/03 257/E23.179 |
| 2009/0212438 A1* | 8/2009 | Kreupl | H01L 21/76898 257/773 |
| 2012/0223440 A1* | 9/2012 | Fujita | H01L 23/48 257/774 |
| 2015/0041990 A1* | 2/2015 | Sekine | H01L 23/481 257/774 |
| 2015/0318263 A1* | 11/2015 | Yu | H01L 23/36 257/774 |
| 2016/0118339 A1* | 4/2016 | Kar-Roy | H01L 23/481 257/763 |
| 2016/0197029 A1* | 7/2016 | Tsai | H01L 23/481 257/774 |
| 2017/0125376 A1* | 5/2017 | Yeh | H01L 24/20 |

OTHER PUBLICATIONS

Pain, Bedabrata, et al. SOI CMOS Imager With Suppression of Cross-Talk. No. NPO-45593. 2009.

* cited by examiner

THROUGH-DIELECTRIC-VIAS (TDVs) FOR 3D INTEGRATED CIRCUITS IN SILICON

RELATED APPLICATIONS

This patent application claims the benefit of priority to U.S. Provisional Patent Application No. 62/162,813 to Uzoh entitled, "Through-dielectric-vias (TDV) in Silicon for 3D Integrated Circuits," filed May 18, 2015, and incorporated herein by reference in its entirety.

BACKGROUND

Three-dimensional integrated circuits (3D ICs) are part of a rapidly evolving technology. Further improvements in substrates, devices, and package structures for 3D IC technology depend on overcoming current challenges, such as decoupling noise in chips and packages that have lower power, higher bandwidth, and higher device-performance than conventional chips and packages.

Conventional through-silicon-vias (TSVs) have certain drawbacks, such as imposing relatively large keep-out-zones around integrated circuit devices because the TSVs cannot be too close to the devices. TSV fabrication conventionally causes permanent tensile stress around the TSVs, which affects the local semiconductor substrate making the mobility of the semiconductor charge carriers uneven and unpredictable for devices in the vicinity of the TSVs. As the TSV-caused stress necessitates larger keep-out-zones, larger dies are needed in turn. Thus, the tensile stress caused by the presence of TSVs can nullify the advantages provided by improvements in wirelength and 3D integration. Moreover, conventional TSVs can impose a mismatch in coefficients of thermal expansion between the adjacent conductor, semiconductor, and insulator materials, and may cause problematic issues of TSV-to-TSV signal coupling, TSV-to-device coupling, and large losses in high frequency signals due to silicon parasitics, when copper of the TSV or other metals diffuse into the nearby silicon substrate.

SUMMARY

Through-dielectric-vias (TDVs) for 3D integrated circuits in silicon are provided. Example structures and processes fabricate conductive vertical pillars for an integrated circuit assembly in a volume of dielectric material instead of in silicon. For example, a block of a silicon substrate may be removed and replaced with dielectric material, and then a plurality of the conductive pillars can be fabricated through the dielectric block. The through-dielectric-vias are shielded from devices and from each other by an intervening thickness of the dielectric sufficient to reduce noise, signal coupling, and frequency losses. The through-dielectric-vias can provide improved stress management and reduced keep-out-zones, reduced via-to-via and via-to-device coupling because of relatively large dielectric spacing and low-k dielectrics that can be used, reduced parasitic capacitance, faster switching speeds, lower heat dissipation requirements, lower production costs, easy miniaturization that is scalable to large assemblies and interposers, and high performance stacked assemblies.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood however; that the accompanying figures illustrate the various implementations described herein and are not meant to limit the scope of various technologies described herein.

DETAILED DESCRIPTION

Overview

Figure 1:
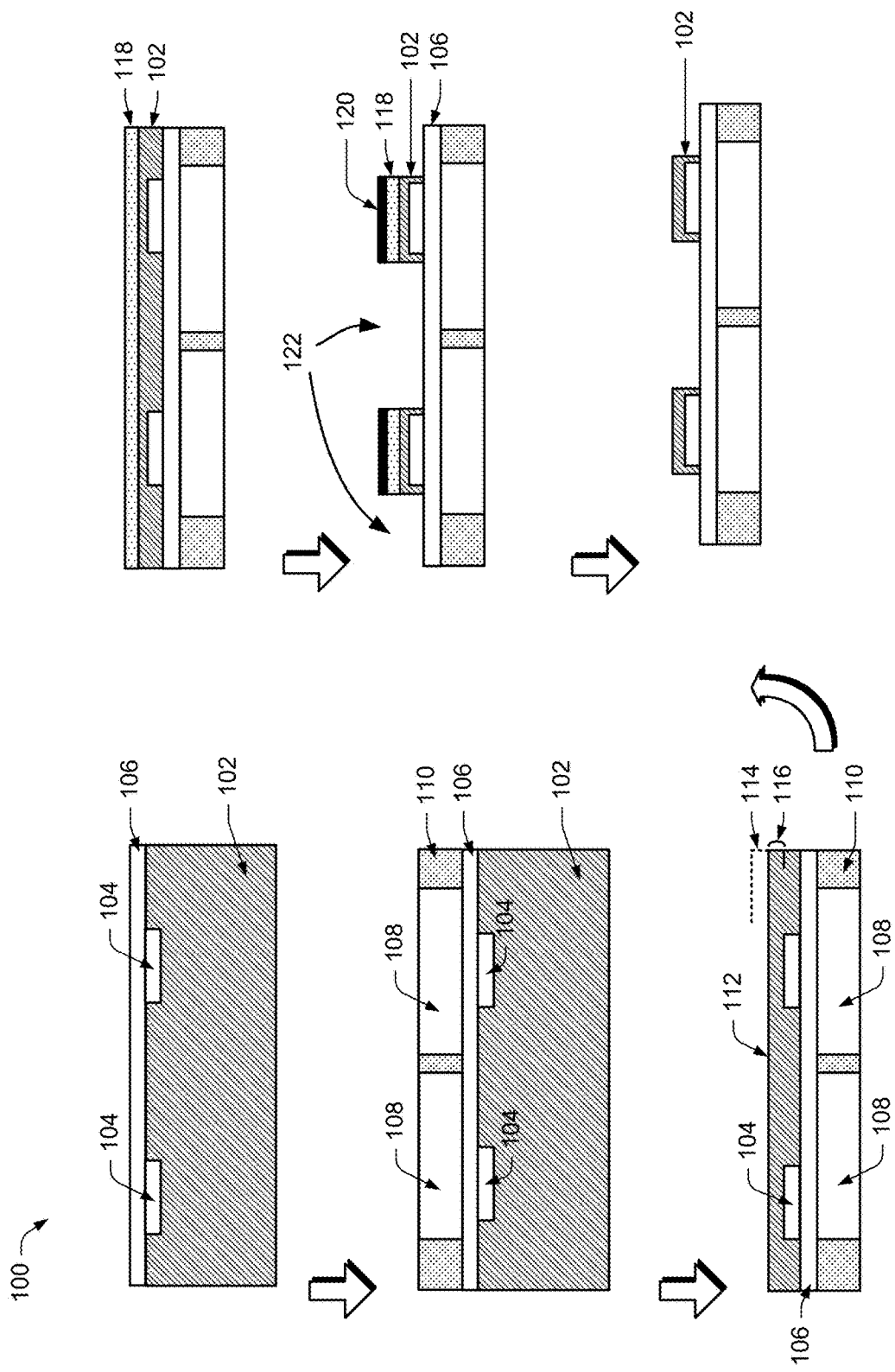
FIGS. 1-2 are diagrams showing example fabrication processes and structures during an example chip-to-wafer (C2W) process that implements through-dielectric-vias in a dielectric.

In the following description, numerous details are set forth to provide an understanding of some embodiments of the present disclosure. However, it will be understood by those of ordinary skill in the art that the systems and methodologies may be practiced without these details and that numerous variations or modifications from the described embodiments may be possible.

This disclosure describes example through-dielectric-vias (TDVs) for 3D integrated circuits in silicon. "Vias," as used herein, are structures that provide an electrical pathway through the thickness of a semiconductor (silicon) die or substrate, between a (bond) pad on the front face and a land on the rear face, for example. "Vias," "vertical vias," and "conductive pillars" are all used interchangeably herein. Conventional through-silicon-vias (TSVs) and example through-dielectric vias, as described herein, are two different types of vertical vias for integrated circuit assembly. As used herein, the terms "chip" and "chips" are equivalent and interchangeable with the respective terms "die" and "dies." As used herein, the terms "chip to wafer," "C2W," "die to wafer," and "D2W" are all interchangeable. The term "device" as used herein adopts the usual meaning in the microelectronic arts of an active or passive electronic component or functional element, chip, die, circuit, or integrated circuit. An integrated circuit is a device also known as a microchip, chip, die, or assembly of electronic components, fabricated as a single unit, which contains other active devices, such as transistors and diodes, and passive devices, such as capacitors and resistors, and their interconnections, fabricated on a thin substrate of semiconductor material, such as silicon.

Example structures and processes provided herein fabricate conductive vertical pillars of an integrated circuit assembly in an isolating block or spacer of dielectric to create the through-dielectric-vias, instead of disposing the conductive pillars as conventional through-silicon-vias (TSVs) in silicon, with very little insulation and barrier metal between the conductor and the silicon. The conductive pillars of the example through-dielectric vias avoid many of the problems inherent in conventional TSVs that are fabricated immediately adjacent to silicon. The example through-dielectric vias are shielded from devices and from each other by an intervening thickness of dielectric sufficient to reduce noise, signal coupling, and frequency losses, for example. The example through-dielectric-vias described herein can provide improved stress management and reduced keep-out-zones, reduced via-to-via coupling since the through-dielectric-vias are now in a dielectric instead of silicon, reduced via-to-device coupling because of the relatively large dielectric spacing and low-k dielectrics that can be used, reduced loss of high frequency signals since metal-to-silicon diffusion and coupling is eliminated and parasitic capacitance is reduced, faster switching speeds, and lower heat dissipation requirements. These features of the example through-dielectric-vias can provide high-performance stacked assemblies, and lower the cost of creating vias, while providing a via technology that is very scalable to large devices and interposers.

The features of using dielectrics for through-dielectric-vias may be adapted to improve conventional TSVs. In an implementation, a conventional TSV is allowed to keep a thin shell of silicon around itself, but a cylinder of dielectric is fabricated around the TSV to isolate the TSV from devices. In another scenario, an intervening wall or column of dielectric may be placed between a conventional TSV and nearby devices to improve signal decoupling between the TSV and devices. When an intervening dielectric is thus used, especially around transistors, a void of air space or porousness may be created in the cylinder, wall, or column of dielectric to achieve an even lower low-k dielectric per unit thickness. In an implementation, a partial vertical wall of dielectric, including a void, for example, creates a structure to control lateral leakage. In an implementation, the through-dielectric-vias can be used with a silicon-on-insulator (SOI) structure or lateral insulator.

The example through-dielectric-vias described herein can be used in many types of stacked structures, such a multi-semiconductor structures, multi-dielectric structures, vertical transistor stacking structures, multiple device stacking structures (face-to-face, back-to-face, back-to-back, etc.), backside illuminated (BSI) sensors with supporting chips, and so forth.

The example through-dielectric-vias can be fabricated by numerous different "via middle" and "via last" processes, to be described below. For example, in an implementation, a segment, portion, or "block" of the silicon that would conventionally be dedicated for TSVs is selectively removed to create a single space or a few spaces in the substrate, and one or more dielectric layers are formed in the space or spaces. The dielectric layers can then be patterned and etched, and metalized to form conductors of the through-dielectric-vias. The side walls of the vias may be smoother than TSVs in conventional silicon, and a separate insulation layer and barrier metal layer may not be needed in the vias, in contrast to conventional TSVs. Many other ways of making example through-dielectric-vias in various structures are also presented.

Example TDV Structures and Processes

Some implementations of the example structures and processes described herein provide conducting pillars that are disposed in an environment of low-k dielectric material. For example, in an implementation, the through-dielectric-vias are embedded in a relatively large block or layer of the pure dielectric material. In other implementations, the conducting pillars are in a shell of silicon (TSVs) because they have been fabricated as through-silicon-vias in silicon, but later the conducting pillars in silicon are isolated from devices by a dielectric wall. Being walled-off by a significant thickness of dielectric can be functionally equivalent to being embedded in pure dielectric material for purposes of decoupling signals between two or more conductors.

Certain basics of making interconnection components are described in U.S. Pat. No. 8,916,781 to Haba et al., entitled, "Cavities Containing Multi-Wiring Structures and Devices," which is incorporated herein by reference in its entirety.

Figure 2:
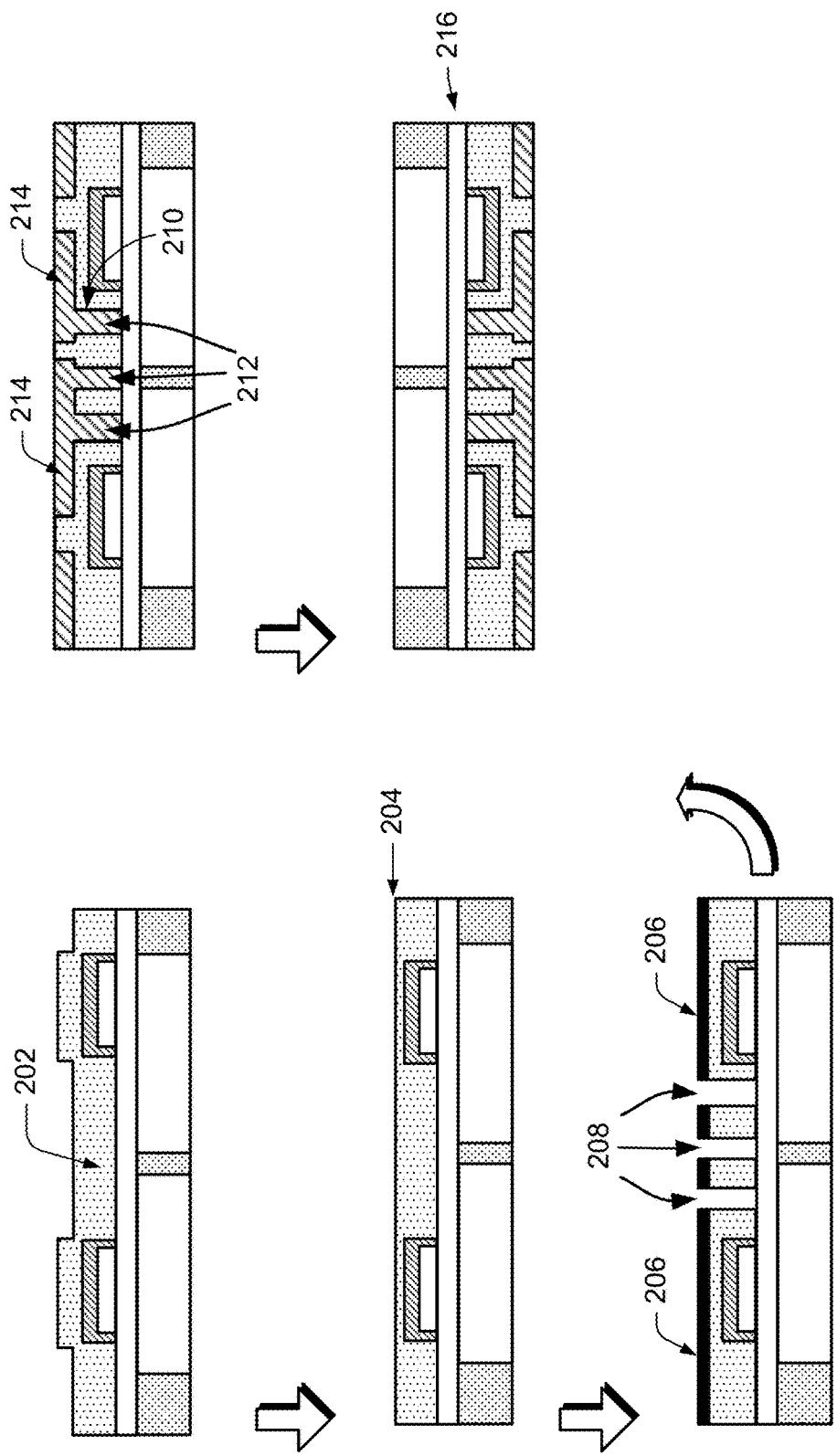

FIGS. 1-2 show an example fabrication sequence for creating through-dielectric-vias (TDVs) in a dielectric material, and example structures. The example process 100 can implement the example through-dielectric-vias during a chip-to-wafer (C2W) process. The dielectric may be an oxide, epoxy, polymer, or glass, or a combination of these, depending on application. Numerous dielectric materials may be used, as long as a particular dielectric material is compatible with in the manufacturing process at hand. Example dielectrics include epoxies, silicon oxides, such as fluorine-doped silicon dioxide, fluorosilicate glass, fluorinated silica glass, carbon-doped silicon dioxide, porous silicon dioxide, porous carbon-doped silicon dioxide; spin-on organic polymeric dielectrics, such as polyimide, polynorbornene, benzocyclobutene, PTFE; and spin-on silicon-based polymeric dielectrics, such as hydrogen silsesquioxane (HSQ), and methylsilsesquioxane (MSQ), for example.

In an implementation, as shown in FIG. 1, the example process 100 begins with a substrate 102 (silicon, for example) and at least one device 104, with one or more back-end-of-line (BEOL) layers 106 of assembly already in place, such as a redistribution layer (RDL). In an implementation, the substrate 102 can be a silicon-on-insulator (SOI) composition, or include a lateral insulator or insulation layer.

Next, chips 108 may be attached. The chips 108 may be integrated circuit chips, a set of electronic circuits, each on one small plate, for example. An encapsulant 110 may be molded over the chips 108, such as a mold resin, epoxy, polyimide, bismaleimide (BMI), cyanate ester (CE), silicone-based encapsulant, or other plastic or polymer filler, or mold material.

On the backside 112, the silicon substrate 102 may be thinned 114, for example down to a remaining layer 116 that is approximately 2-25 µm thick of silicon remaining above tops of the devices 104.

Next, an optional dielectric layer 118 or coating may be applied or formed.

A coating of patterned resist 120 may be applied in a patterning step, to protect device regions 104. Selective substrate removal 122 is performed, by etching, for example.

Next, the front side of the substrate 102 may be cleaned of the resist 120, and dielectric 118, if present, is also removed.

Referring now to FIG. 2, a dielectric coating 202 is applied or formed, for example, with an optionally low-k dielectric material, or with a multi-dielectric layer.

Next, an optional step of planarization 204 may be performed. Dielectric patterning 206 is applied, and etching 208 is performed.

Metallization steps placing conductors 210 in the dielectric 202 are performed to fabricate the through-dielectric-vias 212. Multiple cycles of dielectric layering, patterning, and etching may be performed to achieve the desired interconnects 214 conductively connected to the through-dielectric-vias 212.

At the end of the through-dielectric-via fabrication process 100, instances of the finished assembly 216 may be used as layers in further assembly of a 3D integrated circuit stack.

In summary, the process 100 of FIGS. 1-2 includes determining a section of a substrate 102 or a die composed of silicon to be dedicated for vertical vias 212 through the substrate 102 or the die in an integrated circuit assembly, removing the section of the substrate 102 or die to create a space, filling the space with the dielectric 202 to create a section of dielectric, and constructing the vertical vias 212 through the section of dielectric 202.

In an implementation, the vertical vias 212 have an aspect ratio of approximately 1-10 µm in diameter, to approximately 100-150 µm in height. The section of dielectric 202 may be a volume that is approximately square or approximately rectangular with a thickness approximately equal to the height of the vertical vias 212, a length dimension approximately equal to 2.5-3.0 times the height of the vertical vias 212 plus the length of an area occupied by the vertical vias 212, and a width dimension that is likewise approximately equal to 2.5-3.0 times the height of the vertical vias 212 plus the width of the area occupied by the vertical vias 212.

The size of the volume of dielectric 202 to be added in substitution for a removed section of the substrate 102 can be calculated to provide a particular result, including one of the following, for example: reducing a parasitic capacitance induced by a device of the integrated circuit, increasing a switching speed of a device of the integrated circuit, reducing a heat dissipation requirement of the integrated circuit, reducing a size of a keep-out-zone of the integrated circuit, increasing a signal decoupling between a vertical via and a device of the integrated circuit, reducing a signal coupling between two or more of the vertical vias, reducing a loss of high frequency signals of a component of the integrated circuit, reducing a signal insertion loss, relieving a tensile stress around a vertical via, preventing a lateral signal leakage of a device of the integrated circuit, and reducing a carrier mobility variation of the silicon caused by a tensile stress near a vertical via.

Figure 3:
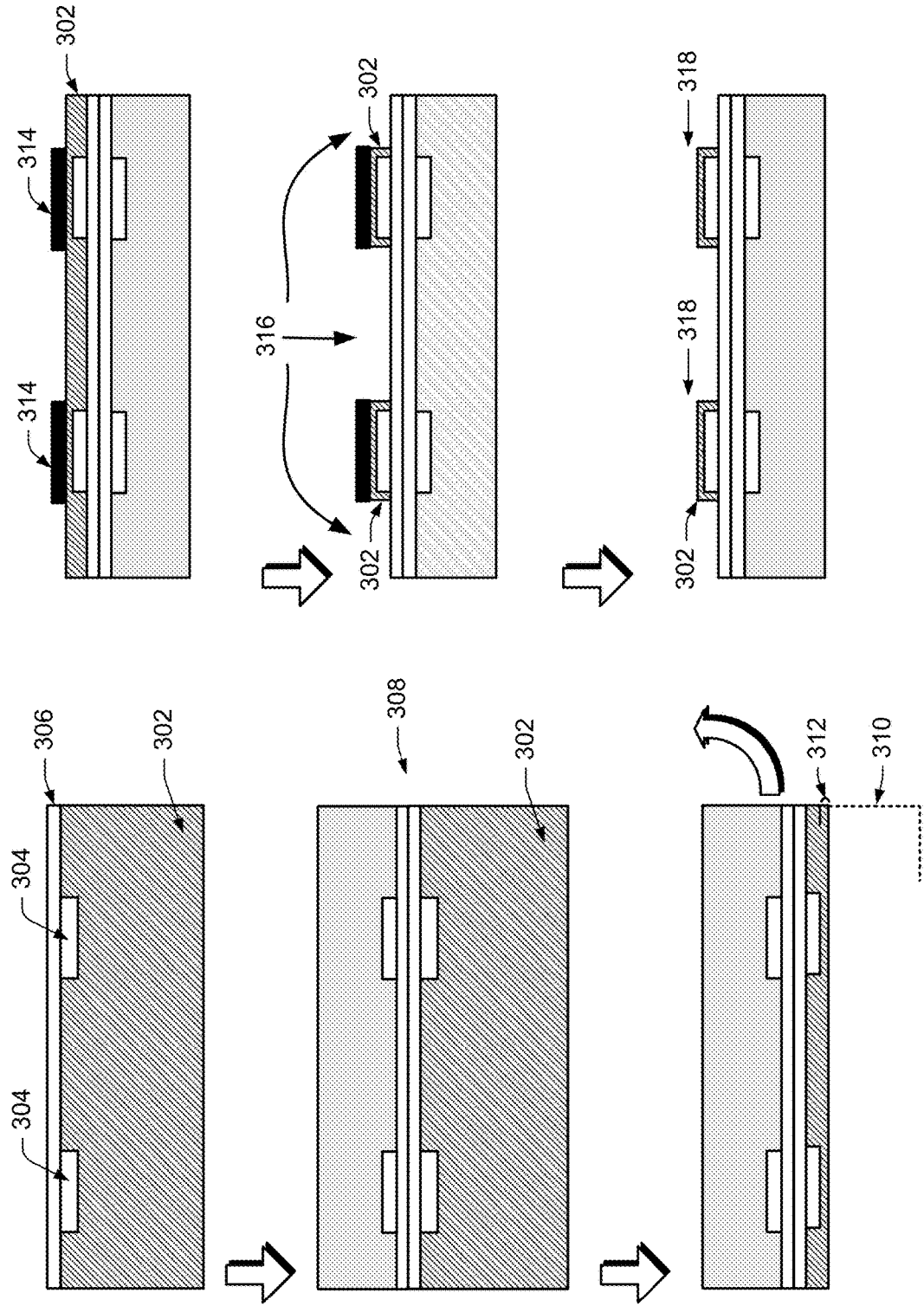
FIGS. 3-4 are diagrams showing example fabrication processes and example structures during an example wafer-to-wafer (W2W) process that implements through-dielectric-vias in back-end-of-line (BEOL) dielectrics.
Figure 4:
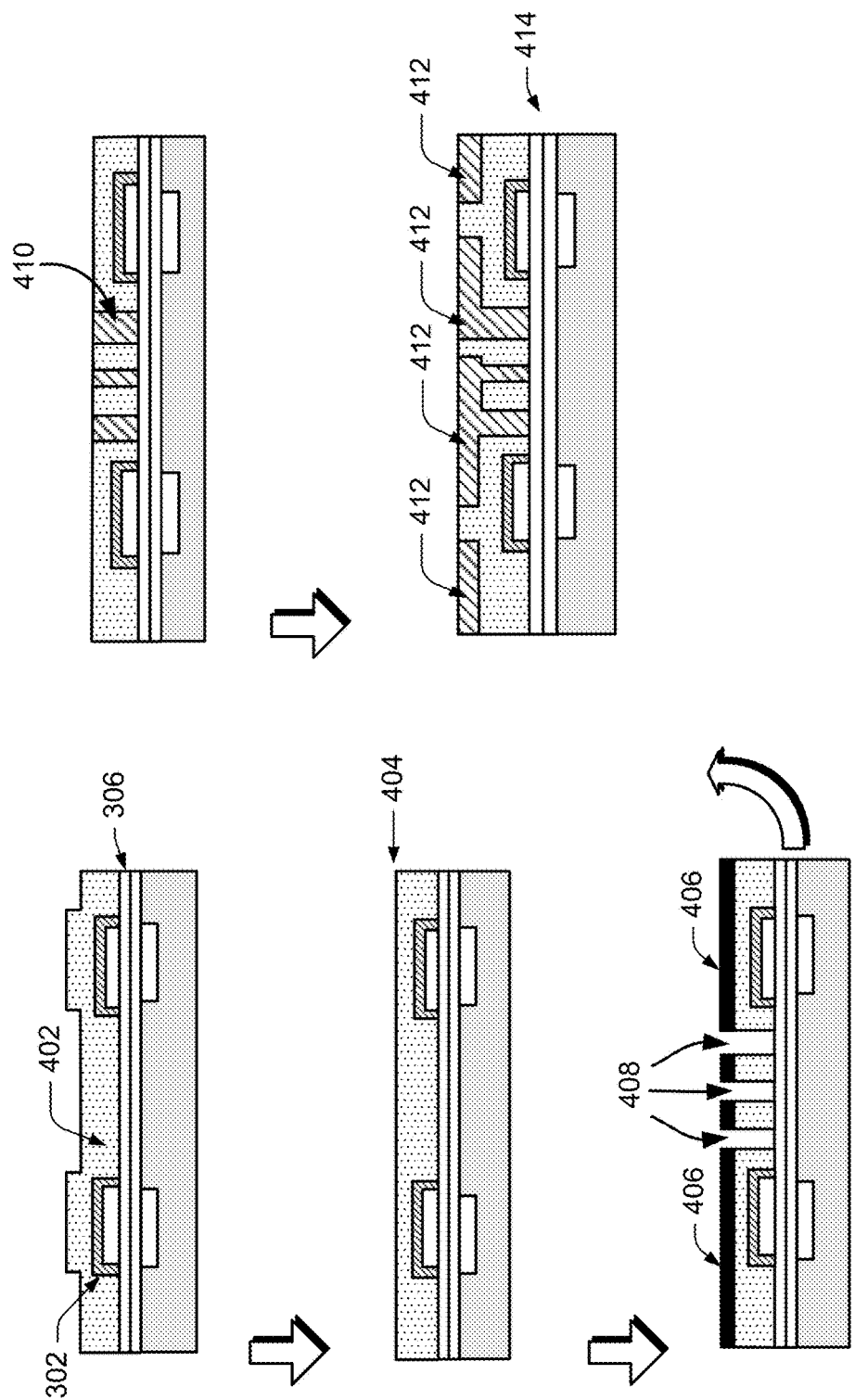

FIGS. 3-4 show another example fabrication sequence for creating through-dielectric-vias in a dielectric material, and example structures. The example process 300 can implement the example through-dielectric-vias in a wafer-to-wafer (W2W) assembly process that implements the through-dielectric-vias in back-end-of-line (BEOL) dielectrics, for example, with one or more back-end-of-line layers 306 of assembly already in place, such as a redistribution layer.

First, a wafer-to-wafer structure 308 is assembled, for example in a face-to-face bonding operation. Backside thinning 310 of the substrate leaves a remaining layer 312 of the silicon substrate 302, such as a 2-25 µm layer 312 of silicon.

Next, a resist 314 may be applied in a patterning step, to protect devices 304 during a subsequent etching process that removes selected sections of the substrate 302. The blocks, pieces, or sections 316 of the silicon substrate 302 are then removed. The resist 314 is then removed 318 and the substrate 302 cleaned.

Referring to FIG. 4, a dielectric coating 402 is then applied or formed, using an optional low-k dielectric material, or using a multi-dielectric layer, for example. An optional planarization step 404 may be performed.

Next, dielectric patterning 406 is applied, and etching 408 is performed. Metallization steps placing conductors in the dielectric 402 are performed to fabricate the through-dielectric-vias 410. Multiple cycles of dielectric layering, patterning, and etching may be performed to achieve the desired interconnects 412 conductively connected to the through-dielectric-vias 410.

At the end of the through-dielectric-via fabrication process 300, instances of the finished assembly 414 may be used as layers in further assembly of a 3D integrated circuit stack.

Figure 5:
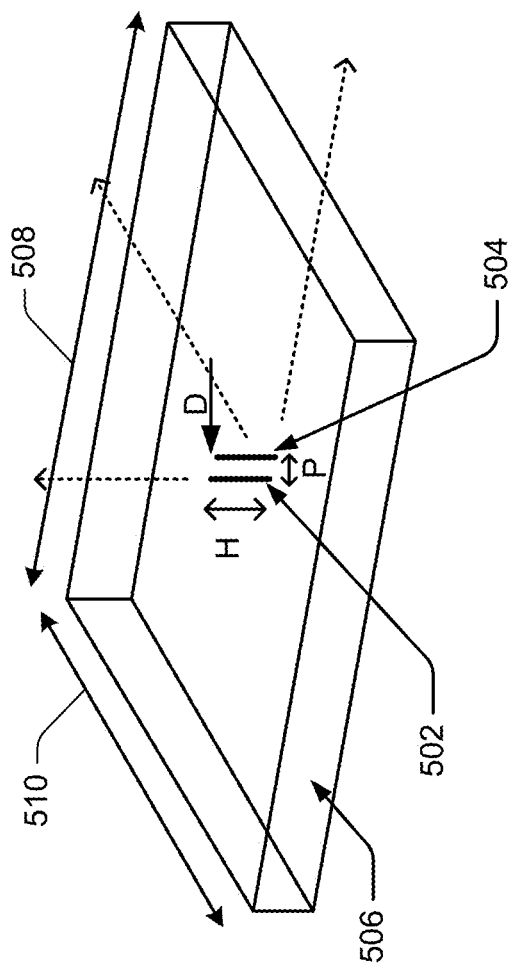
FIG. 5 is a diagram showing vias in a volume of a glass dielectric.
Figure 5:
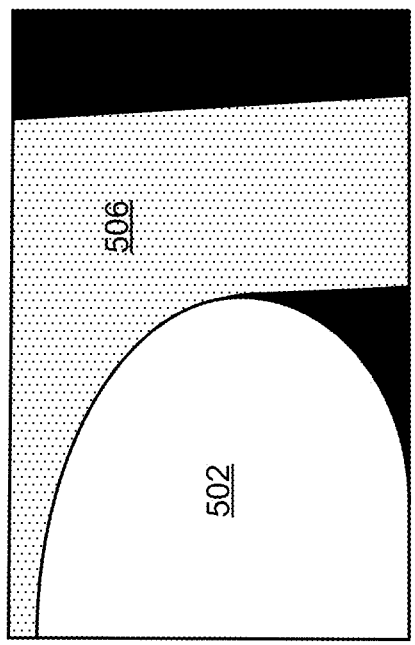

FIG. 5 shows vias 502 & 504 in an example block of dielectric: a glass box dielectric 506. The glass box dielectric 506 may represent the section of dielectric 202 in FIG. 2, or the section of dielectric 402 in FIG. 4, for example. The dielectric 506 may be a silicon oxide dielectric, a silicon dioxide, a fluorosilicate glass, a fluorinated silica glass, a glass epoxy, or another dielectric. In an implementation, the vertical via length H is approximately 100 µm, and the via diameter D is 10 µm, for example. Conductivity of the copper conductor is $5.8 \times 10^7$ S/m. Glass box length 508 may be, for example, approximately 280 µm+via pitch. The glass box width 510 may also be, for example, approximately 280 µm+via pitch, but the length and width of a given section of dielectric 506 can be selected to provide a thickness of the dielectric 506 sufficient to provide the desired isolation between the through-dielectric-vias 502 & 504 and nearby devices, or other vias.

Figure 6:
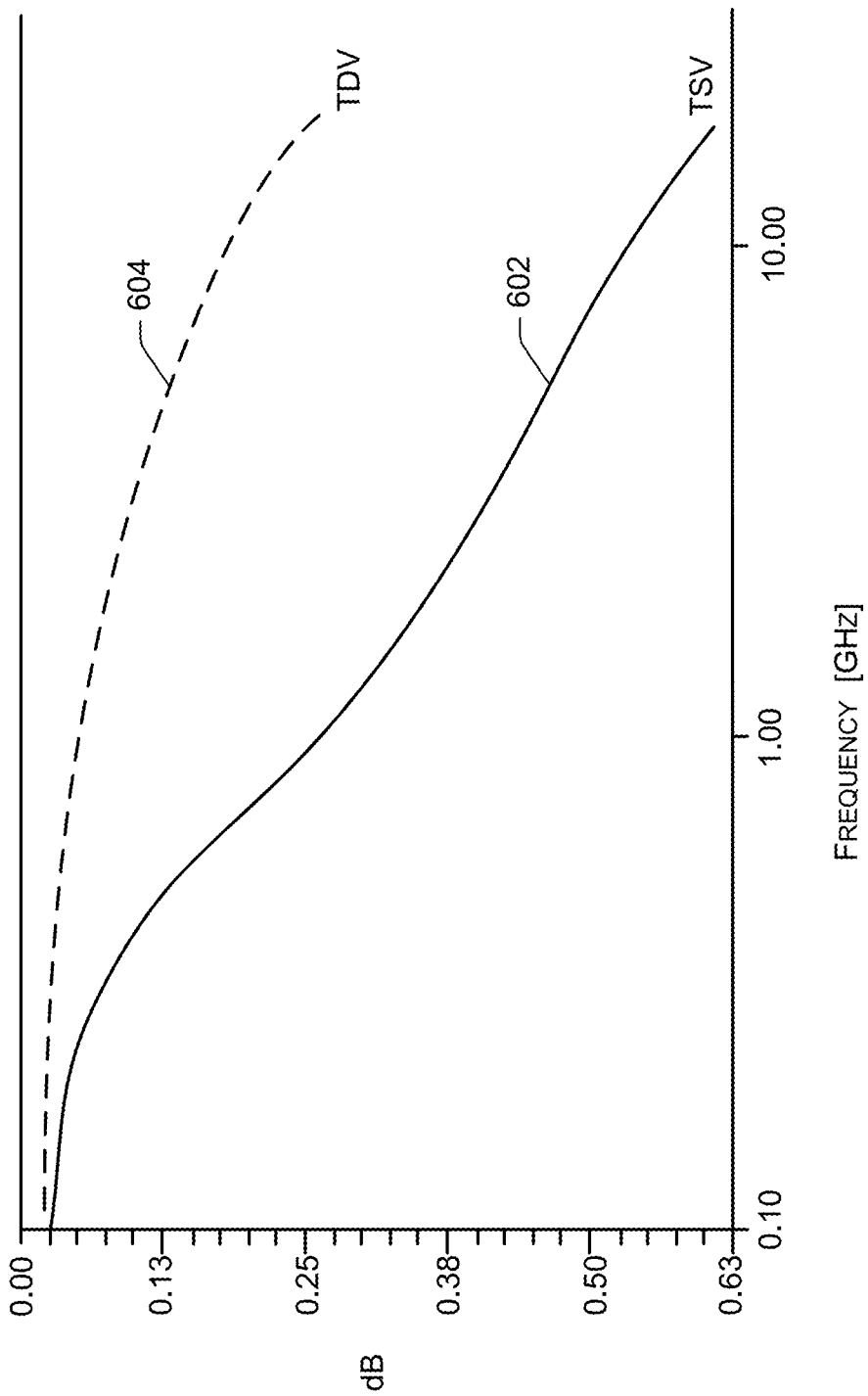
FIG. 6 is a diagram showing an example comparison between conventional through-silicon-vias (TSVs) and example through-dielectric-vias in glass, with respect to insertion loss.

FIG. 6 shows a comparison between insertion losses, comparing example through-dielectric vias with conventional through-silicon-vias (TSVs). In this example comparison, the dielectric is a glass type dielectric. Insertion loss is the loss of signal power resulting from the presence of the particular via (conducting pillar) in a device, and the loss in signal power is expressed as positive value of decibel (dB) loss units, while an insertion gain is expressed as a negative value of the decibel loss units. FIG. 6 shows the comparison, with a 20 µm pitch between conducting features. When the frequency (in GHz) of the signal increases, the insertion loss of the conventional through-silicon-vias 602 falls much more dramatically than the insertion loss of the example through-dielectric-vias (or through-glass-vias) 604.

Figure 7:
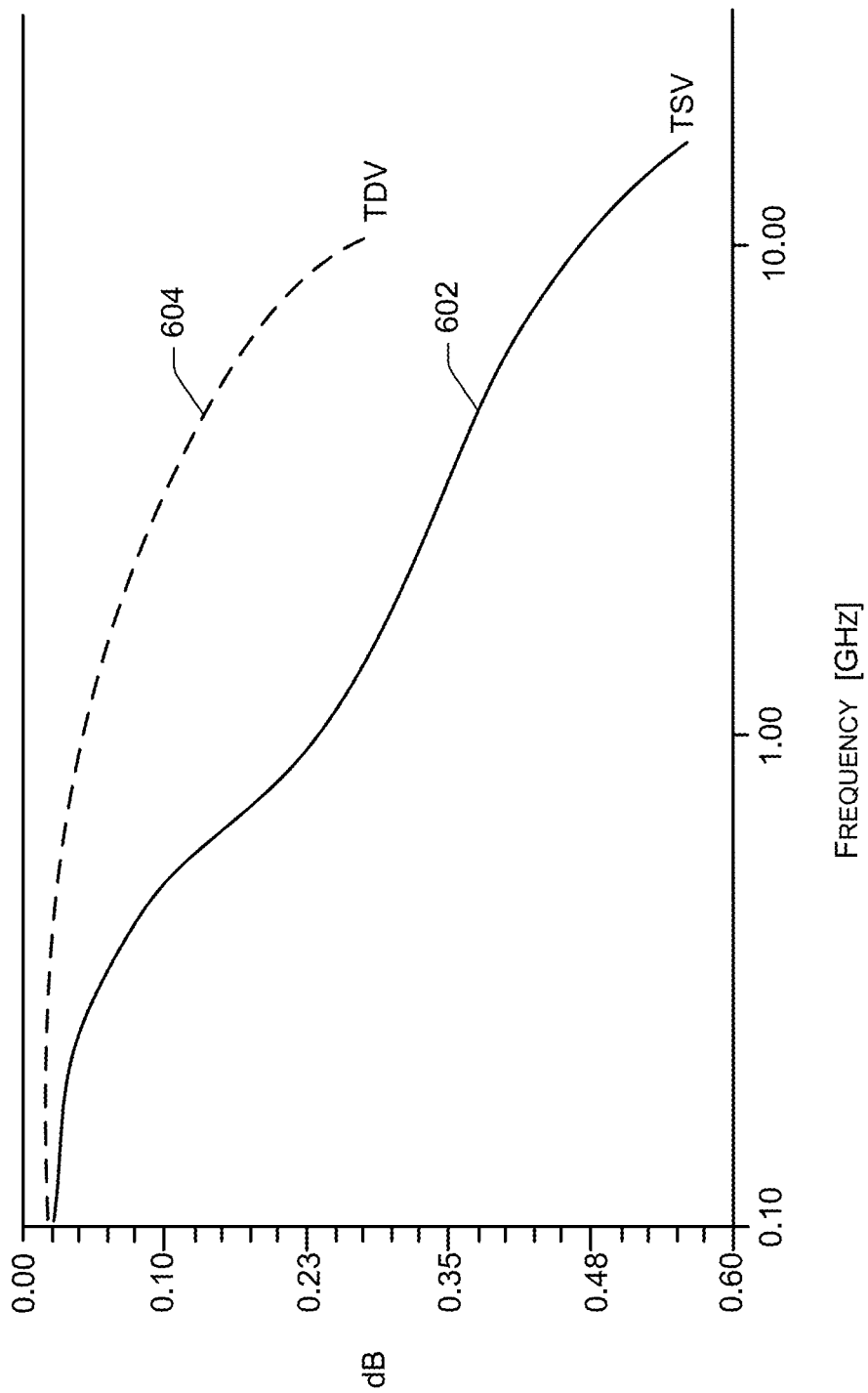
FIG. 7 is a diagram showing another example comparison between conventional through-silicon-vias (TSVs) and example through-dielectric-vias in glass, with respect to insertion loss.

Likewise, in FIG. 7, at a pitch of 50 µm pitch between conducting features, when the frequency (in GHz) of the signal increases, the insertion loss of the conventional through-silicon-vias 702 falls much more dramatically than the insertion loss of the example through-dielectric-vias (or through-glass-vias) 704.

Figure 8:
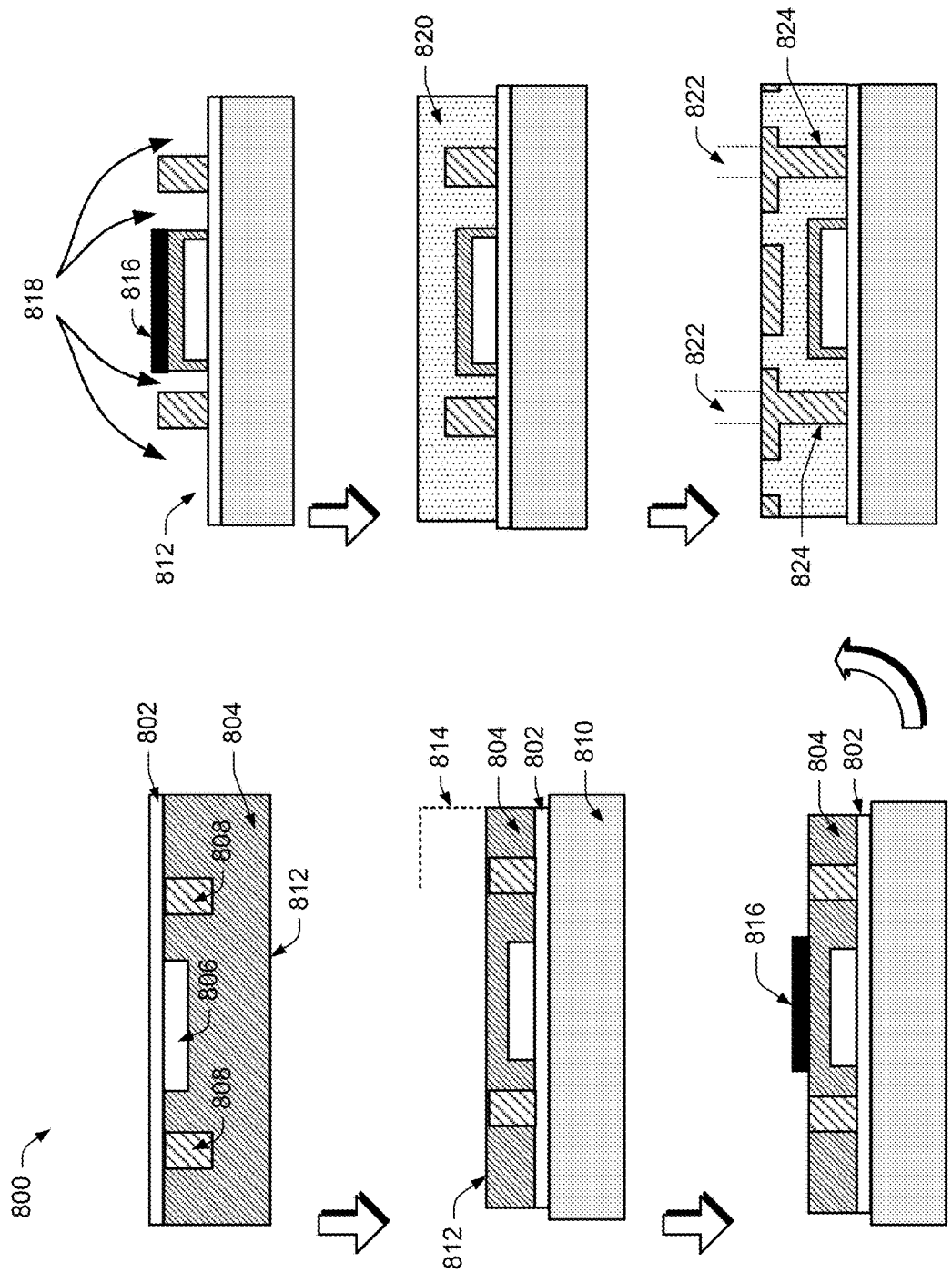
FIG. 8 is a diagram showing an example first via middle process of implementing through-dielectric-vias.

FIG. 8 shows another example fabrication sequence for creating through-dielectric-vias in a dielectric material, and example structures. The example process 800 implements the example through-dielectric-vias in a via middle process that implements the through-dielectric-vias in back-end-of-line (BEOL) dielectrics, for example, with one or more back-end-of-line layers 802 of assembly already in place, such as a redistribution layer (RDL).

In an implementation, the example process 800 begins with a substrate 804, a device 806, at least one back-end-of-line layer 802, and through-substrate conductors 808.

The front side of the assembly may be attached to a carrier 810. On the backside 812, partial thinning 814 of the substrate 804 is performed.

In an implementation, backside patterning resist 816 is then applied, to protect device areas from subsequent etching. Silicon etching 818 from the backside 812 creates spaces to isolate the conductors 808 from device 806. A dielectric coating 820 is applied or formed, and planarized as needed.

Back-end-of-line formation of via holes 822, by patterning and etching, for example, is performed, and metallization of the through-dielectric vias 824 is performed. Additional cycles to add bond pads 826, lands, or interconnects coupled to the through-dielectric-vias 824 may be performed.

Figure 9:
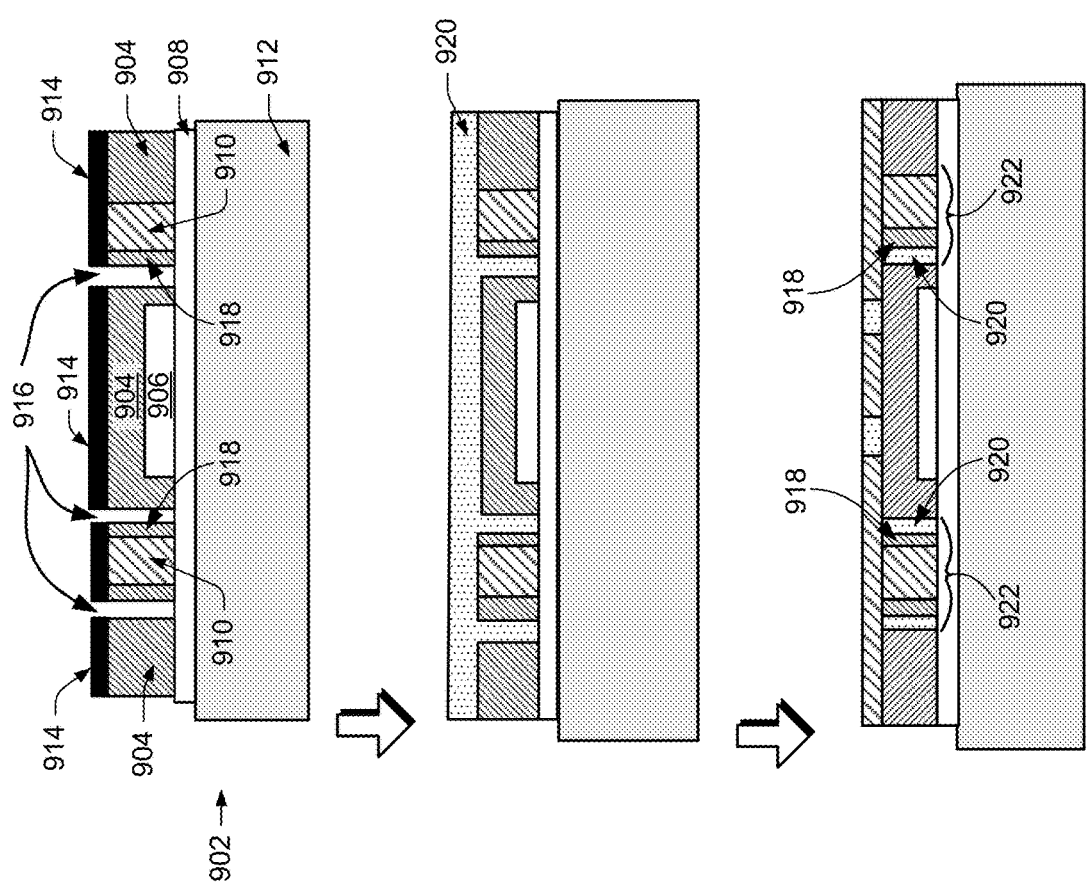
FIGS. 9-11 are diagrams showing three variations of example second via middle processes for implementing through-dielectric-vias.
Figure 10:
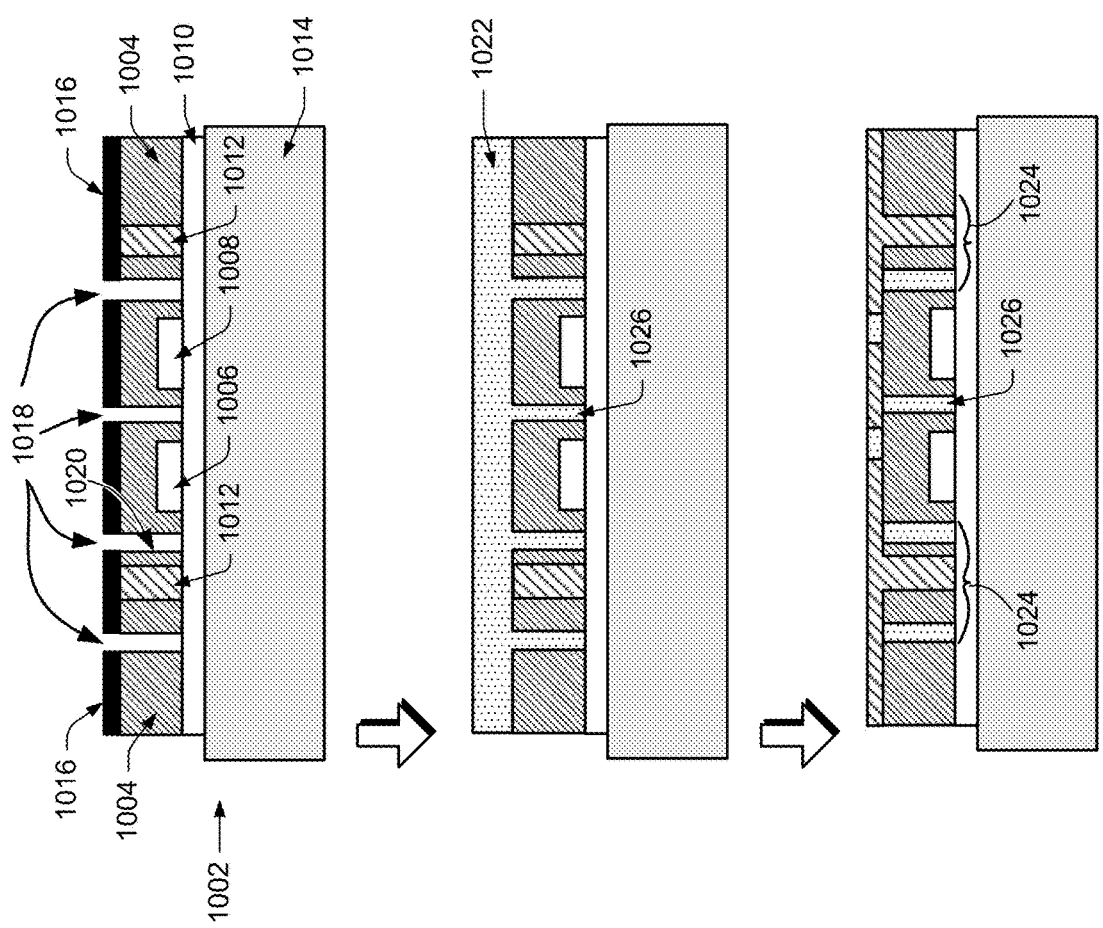
Figure 11:
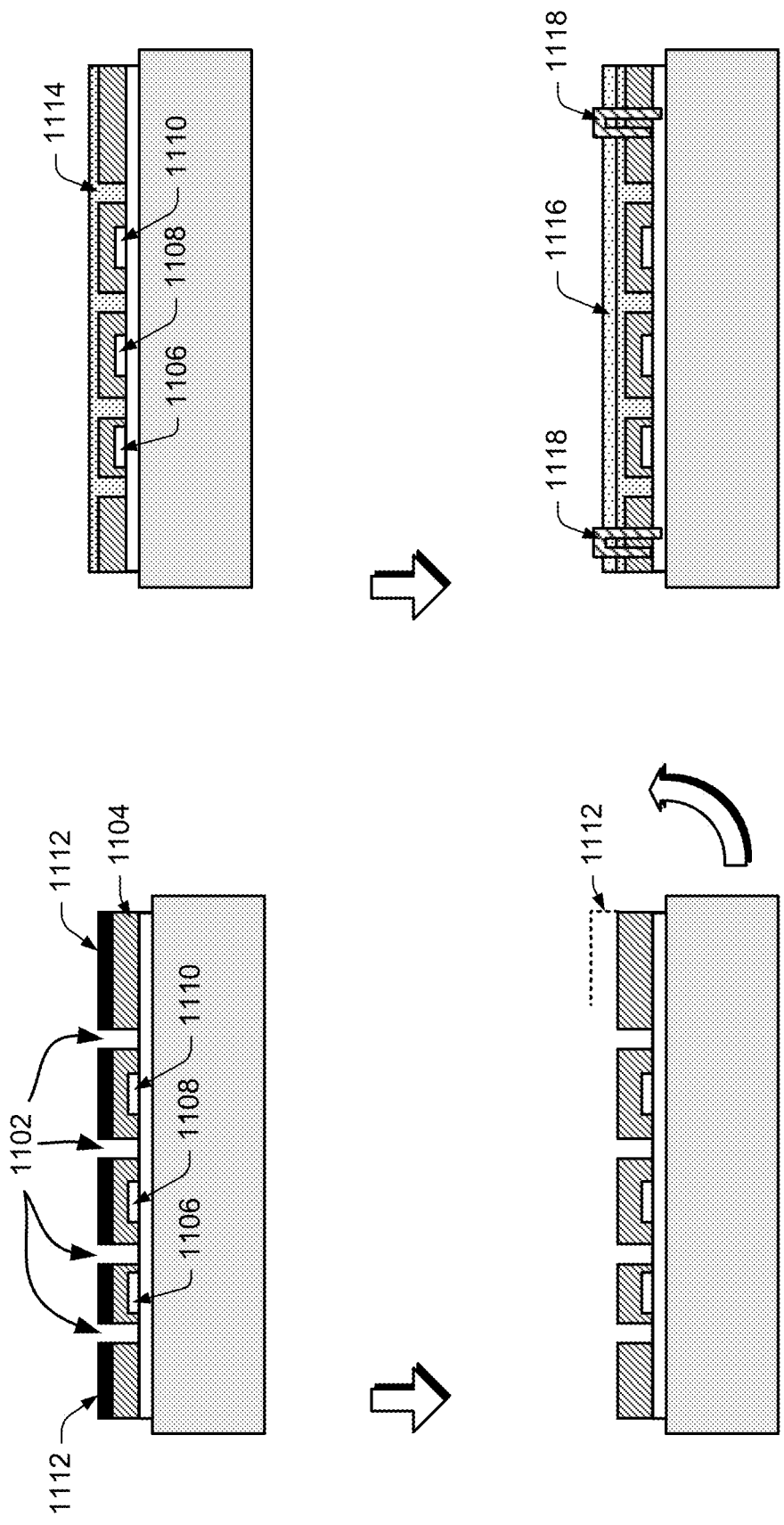

FIGS. 9-11 show three variations of example via middle processes for implementing through-dielectric-vias in silicon, in which components are walled-off from each other with a cylinder, column, or wall of dielectric to reduce or eliminate unwanted signal coupling between conductors and devices.

In FIG. 9, an assembly 902 has a substrate 904, a device 906, one or more back-end-of-line layers 908, and vertical conductors 910, all attached to a carrier 912, with patterning resist 914 applied and silicon etching 916 performed from the backside of the substrate 904, to isolate the conductors 910 from devices 906. However, a thin shell 918 of silicon is left remaining around the conductors 910.

Next, a dielectric coating 920 on the backside of the assembly 902 is applied or formed, preferably using low coefficient of thermal expansion (CTE) materials, low-k dielectric materials, or both. The dielectric 920 fills the etched trenches 922, forming a cylinder, column, or wall of the dielectric 920 around the conductors 910, together with their silicon shells 918, or between the conductors 910 with their silicon shells 918, and other devices 906 and conductors 910.

Backside planarization and metallization are accomplished to finish forming the through-dielectric-vias in silicon 922. This example technique places conducting pillars 910 in relatively thin shells of silicon 904 & 918, but the conducting pillars 910 are isolated from devices 906 by a wall or other barrier of the dielectric 920.

FIG. 10 shows an example via middle approach in which dielectric is applied to isolate existing conductors in silicon from each other and from devices. The dielectric also isolates devices from each other with a backside shallow trench isolation (STI) feature, separate from the isolation of the through-dielectric-vias from each other. The STI feature fabricates a wall of dielectric between devices at the same time as walling-off the through-dielectric vias.

In FIG. 10, an assembly 1002 has a substrate 1004, devices 1006 & 1008, one or more back-end-of-line layers 1010, and vertical conductors 1012, all attached to a carrier 1014, with patterning resist 1016 applied and silicon etching 1018 performed from the backside of the substrate 1004, to isolate the conductors 1012 from devices 1006 & 1008. A thin shell 1020 of silicon may be left remaining around the conductors 1012.

Next, a dielectric coating 1022 on the backside of the assembly 1002 is applied or formed, preferably using low coefficient of thermal expansion (CTE) materials, low-k dielectric materials, or both. The dielectric 1022 fills the etched trenches 1018, forming a cylinder, column, or wall of the dielectric around the conductors 1012 with their silicon shells 1020, or between the conductors 1012 with their silicon shells 1020, and other devices 1006 & 1008 and conductors.

Backside planarization and metallization are accomplished to finish forming the through-dielectric-vias in silicon 1024. This example technique places conducting pillars 1012 in silicon, but the conducting pillars 1012 are isolated from devices 1006 & 1008 and from each other by a wall or other barrier of the dielectric 1022. Moreover, the devices 1006 & 1008 are isolated from each other because the backside shallow trench isolation (STI) feature 1026 reduces the device-to-device coupling, separate from the isolation of the through-dielectric-vias in silicon 1024.

In FIG. 11, in an implementation, a via middle approach etches trenches 1102 in a silicon substrate 1104 from the backside (after thinning) to isolate devices, such as image sensors 1106 & 1108 & 1110 from each other and from other devices. Next, resist 1112 is removed, and the substrate is cleaned.

Then, an anti-reflection dielectric coating 1114 is formed on surface and cavity side walls. Next, a dielectric layer 1116 is applied and metal forming 1118 is performed. This example technique provides an anti-reflection dielectric coating 1114 in backside isolation cavities. The example technique provides backside shallow trench isolation (STI) with the anti-reflection dielectric 1114, to reduce noise and crosstalk between image sensors 1106 & 1108 & 1110.

Figure 12:
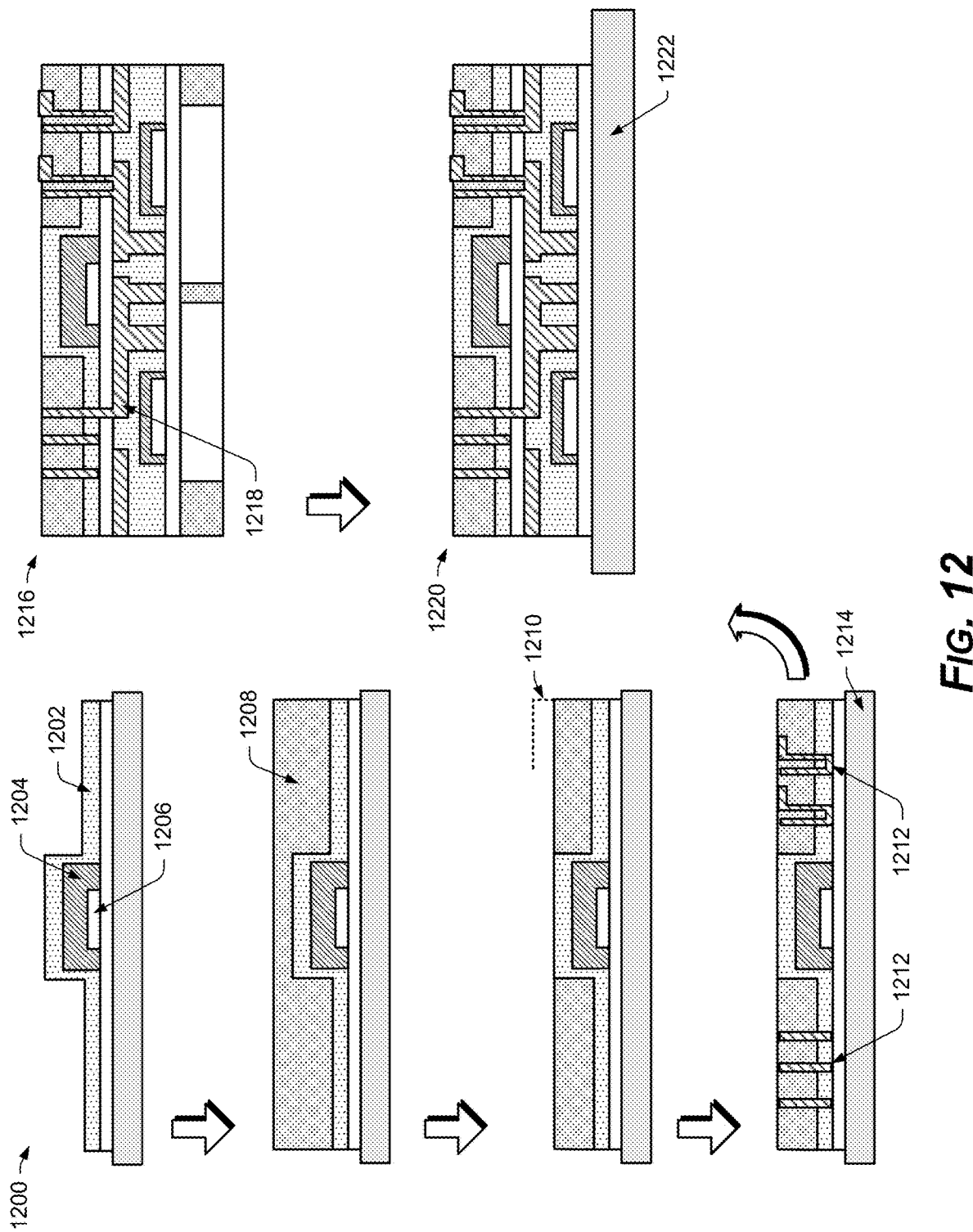
FIGS. 12-13 are diagrams showing an example polymer-on-inorganic process of implementing through-dielectric-vias.

FIG. 12 shows an example polymer-on-inorganic dielectric process 1200 for implementing through-dielectric-vias. In an implementation, a conformal dielectric coating 1202 is applied on the backside of the silicon substrate 1204 and device 1206, preferably using a low coefficient of thermal expansion (CTE) dielectric material.

Then, a polymer layer coating 1208 is applied over the conformal dielectric coating 1202. Optional polymer kiss polishing 1210 may be performed. Damascene and non-damascene metal formation 1212 may then be fabricated.

The carrier 1214 is removed, and structure assembly 1216 and through-dielectric metallization 1218 is performed. The assembled structure 1220 may be attached to a substrate 1222 or further stacked in 3D assembly.

Figure 13:
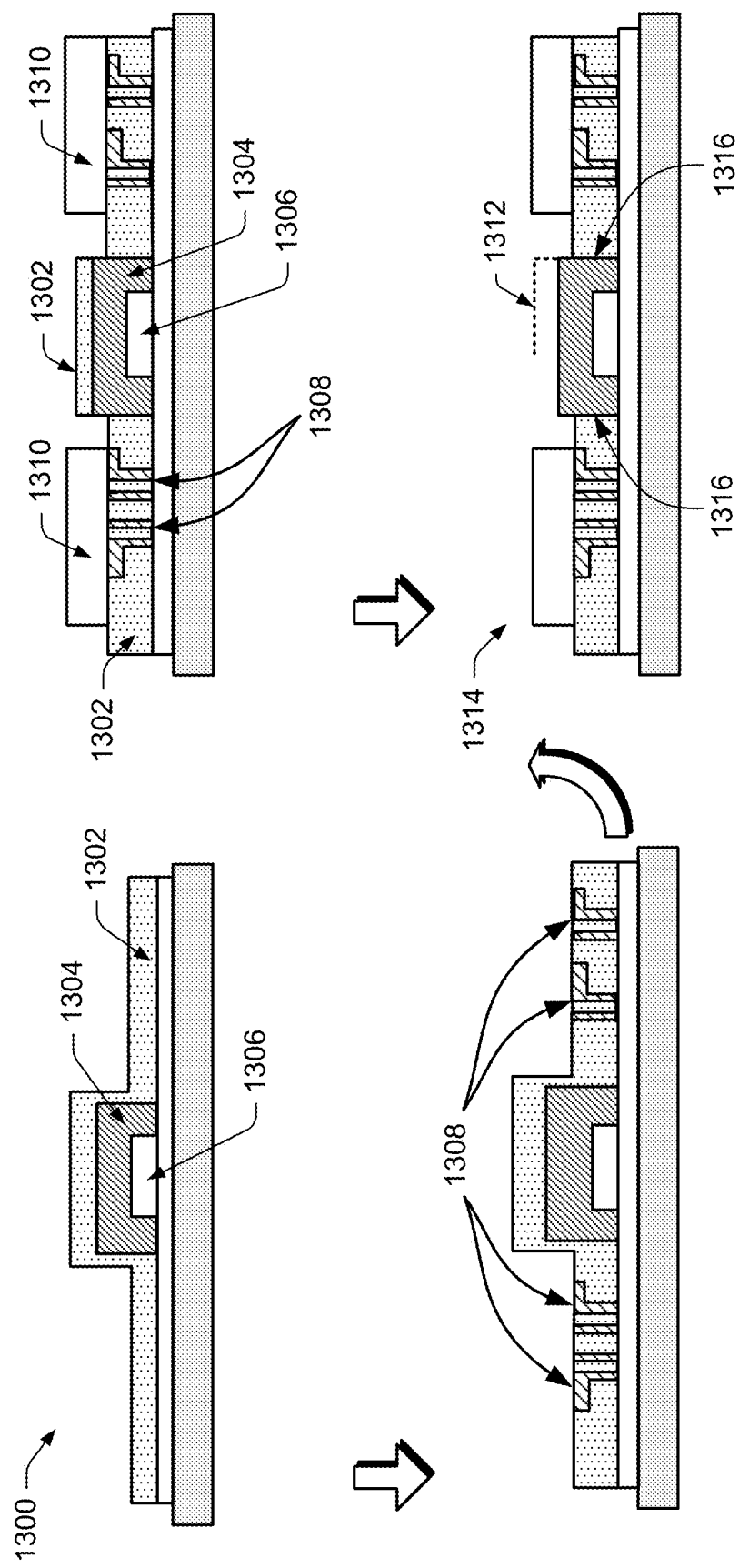

FIG. 13 shows another process 1300 for fabricating through-dielectric-vias, in which metal features are formed in a dielectric region. In an implementation, a conformal dielectric coating 1302 is applied on the backside of the silicon substrate 1304 and on devices 1306, such as sensors. The dielectric is preferably composed of a low coefficient of thermal expansion (CTE) dielectric material. Then conductive metal features 1308 are formed in the dielectric coating 1302.

One or more chips 1310 are attached to a part of the dielectric layer 1302 and/or to the metal features 1308. Then, in one implementation, the dielectric coating 1302 is removed 1312 from above the devices (transistors or sensors) 1306, providing a finished structure 1314 that is without the dielectric coating 1302 on the silicon layer 1304 over transistors and sensors 1306. In an implementation, despite the top removal of the dielectric 1302, the device 1306 with silicon layer 1304 may still be isolated by a cylinder 1316 of the dielectric 1302.

Figure 14:
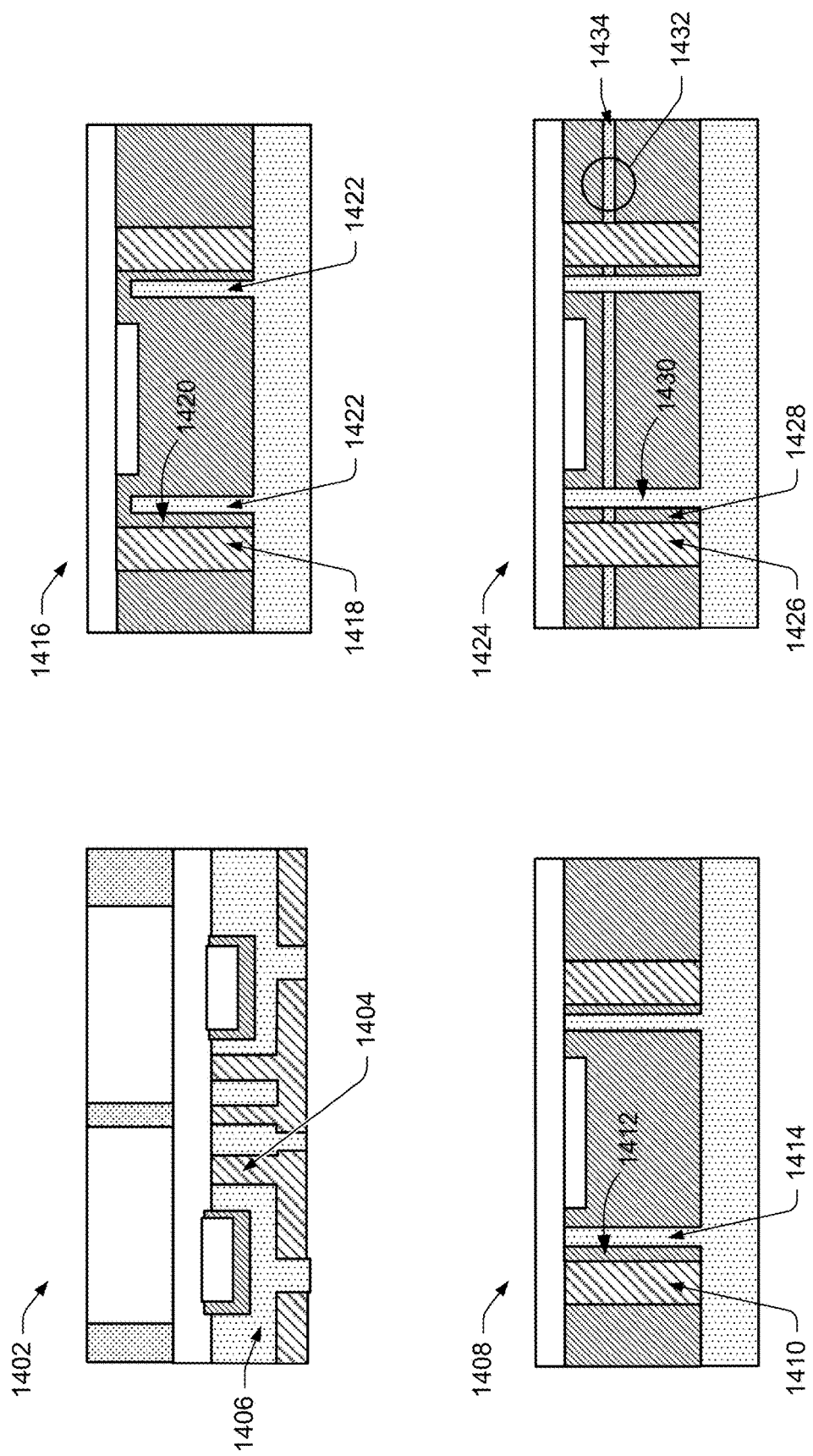
FIGS. 14-15 are diagrams showing example through-dielectric-via structures produced by the previously described processes.
Figure 15:
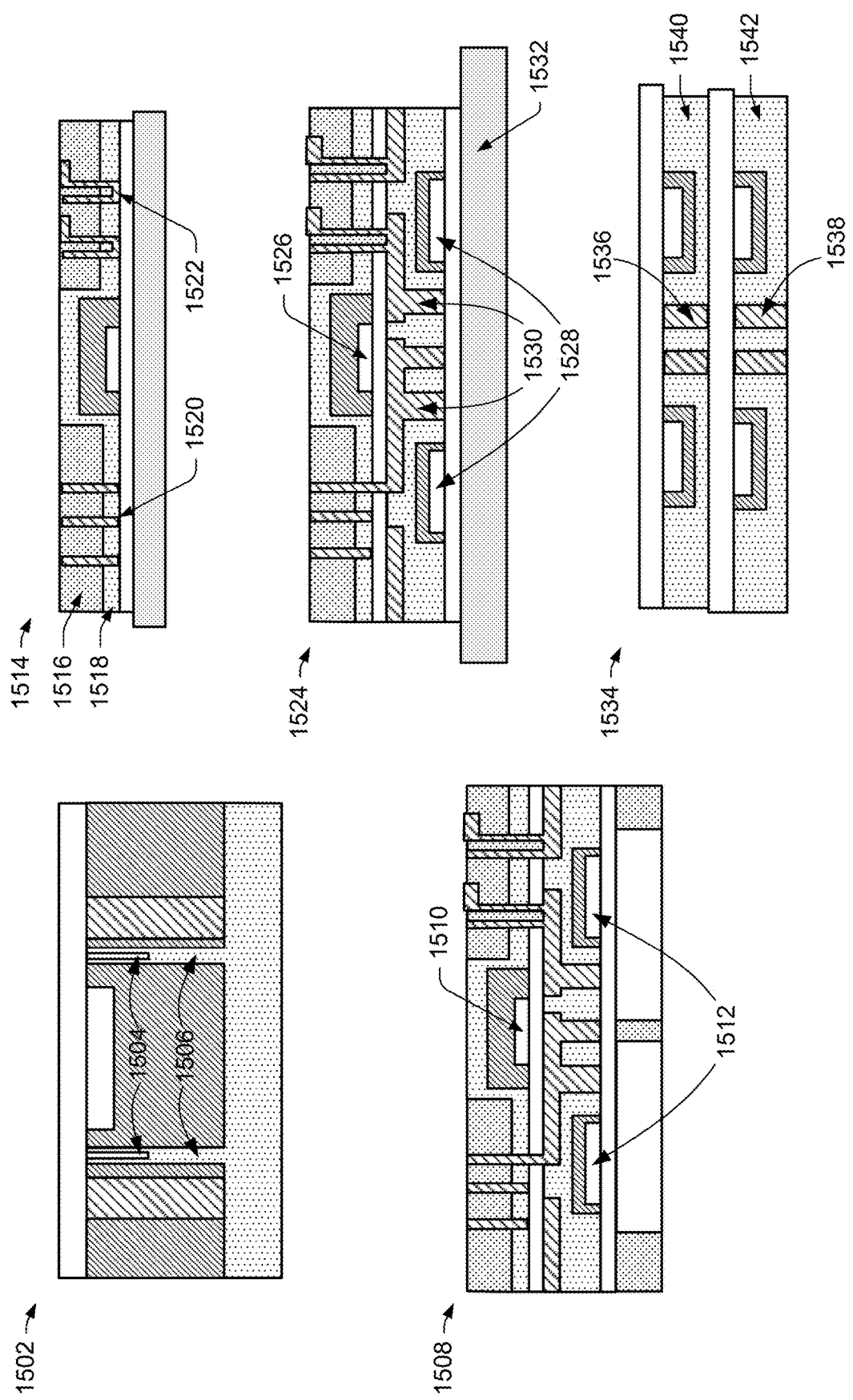

FIGS. 14-15 show example through-dielectric-via (TDV) structures that can be fabricated by the previously described processes.

In FIG. 14, example structure 1402 shows example through-dielectric-vias 1404 in a pure layer of dielectric 1406.

Example structure 1408 shows example through-silicon-vias 1410 in a shell of silicon 1412 with dielectric column spacers 1414.

Example structure 1416 shows example through-silicon-vias 1418 in shells of silicon 1420 with partial walls of dielectric 1422 for controlled lateral leakage.

Example structure 1424 shows example through-silicon-vias 1426 in a shell of silicon 1428 with dielectric column spacers 1430. The example structure 1424 is based on a silicon-on-insulator (SOI) substrate 1432, with a lateral insulator 1434.

In FIG. 15, example structure 1502 shows example voids 1504 in a dielectric spacer 1506. The void 1504 may be an air space, with air having a low-k dielectric constant of approximately 1.0. The void 1504 may also be introduced by fabricating a porous dielectric spacer 1506.

Example structure 1508 shows an example through-dielectric metal multi-semiconductor 1510 & 1512 architecture.

Example structure 1514 shows an example multi-dielectric 1516 & 1518 configuration, with through-dielectric metal connection structures 1520 & 1522.

Example structure 1524 shows vertical stacking of transistors 1526 & 1528 connected with through-dielectric metal features 1530 on a substrate 1532.

Example structure 1534 shows multiple device stacking made possible by the example through-dielectric-vias 1536 & 1538, such as face-to-face (F2F) stacking, back-to-face (B2F) stacking, back-to-back (B2B) stacking, and so forth. Structure 1534 shows example back-to-face (B2F) stacking, with example through-dielectric-vias 1536 & 1538 disposed in pure dielectric 1540 & 1542.

Figure 16:
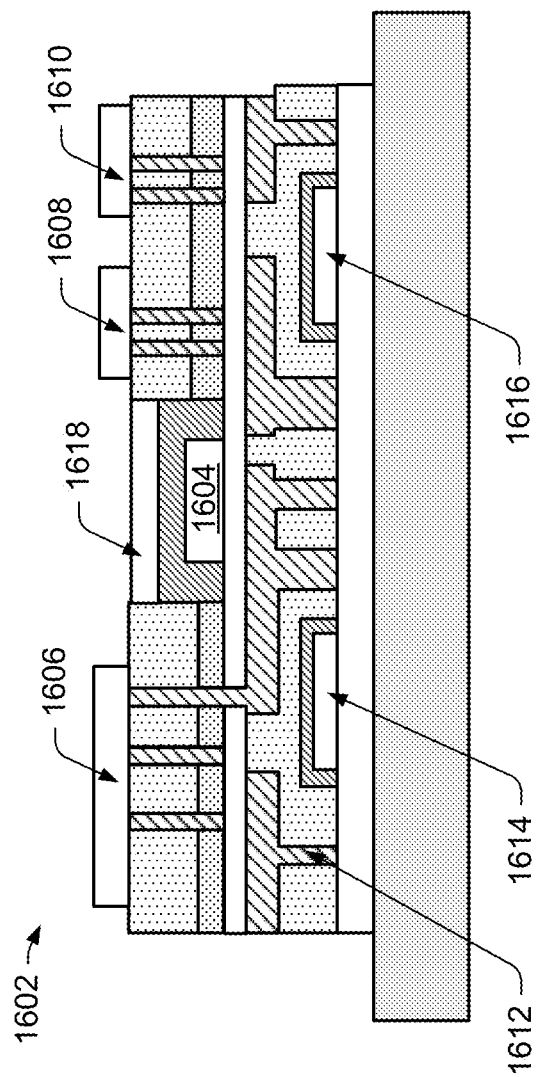
FIG. 16 is a diagram showing an example through-dielectric-via structure produced by the previously described processes, including a backside illuminated (BSI) sensor and supporting chips.

FIG. 16 shows an example through-dielectric-via structure 1602 produced by the previously described processes, including a backside illuminated (BSI) sensor 1604 and supporting chips 1606 & 1608 & 1610, with dielectric isolation of conductors 1612, sensor 1604, devices 1614 & 1616 (& 1604), and chips 1606 & 1608 & 1610. A clear dielectric 1618 can form the light aperture.

Example Methods

Figure 17:
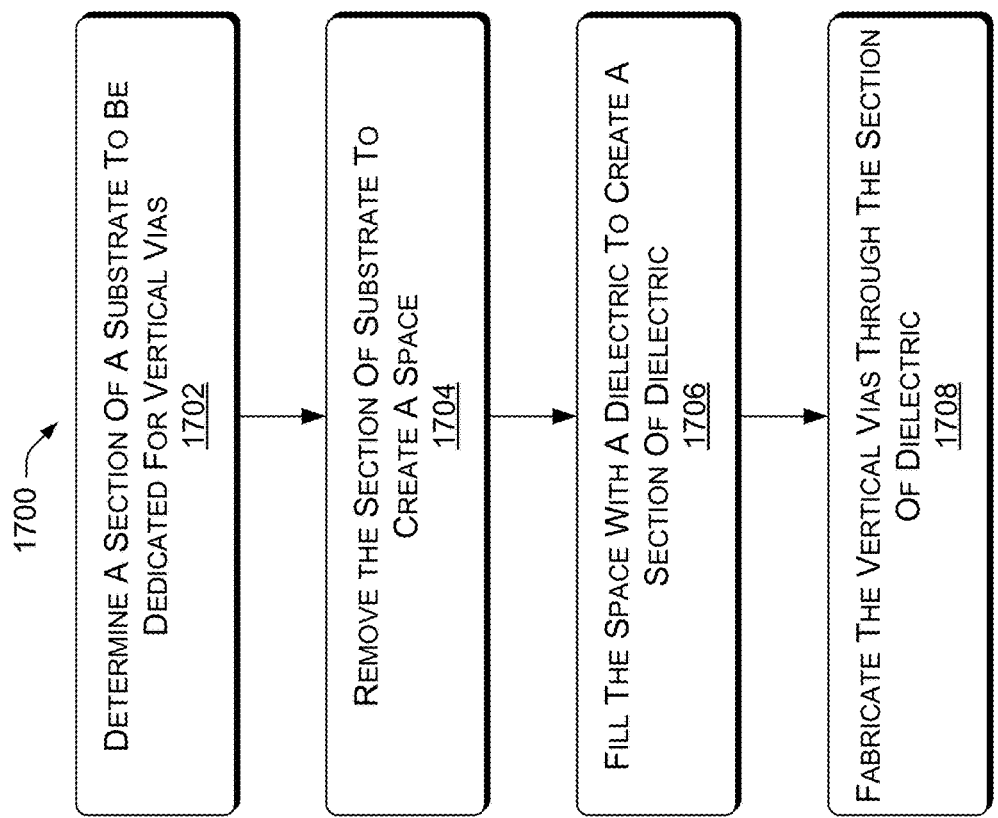
FIG. 17 is a flow diagram of an example method of fabricating through-dielectric-vias.

FIG. 17 shows an example method 1700 of fabricating through-dielectric-vias. In the flow diagram of FIG. 17, operations of the example method 1700 are shown in individual blocks.

At block 1702, a section of a substrate or a die to be dedicated for vertical vias through the substrate or the die in an integrated circuit assembly is determined.

At block 1704, the section of the substrate or the die is removed to create a space.

At block 1706, the space is filled with a dielectric to create a section of dielectric.

At block 1708, the vertical vias are fabricated through the section of dielectric.

Figure 18:
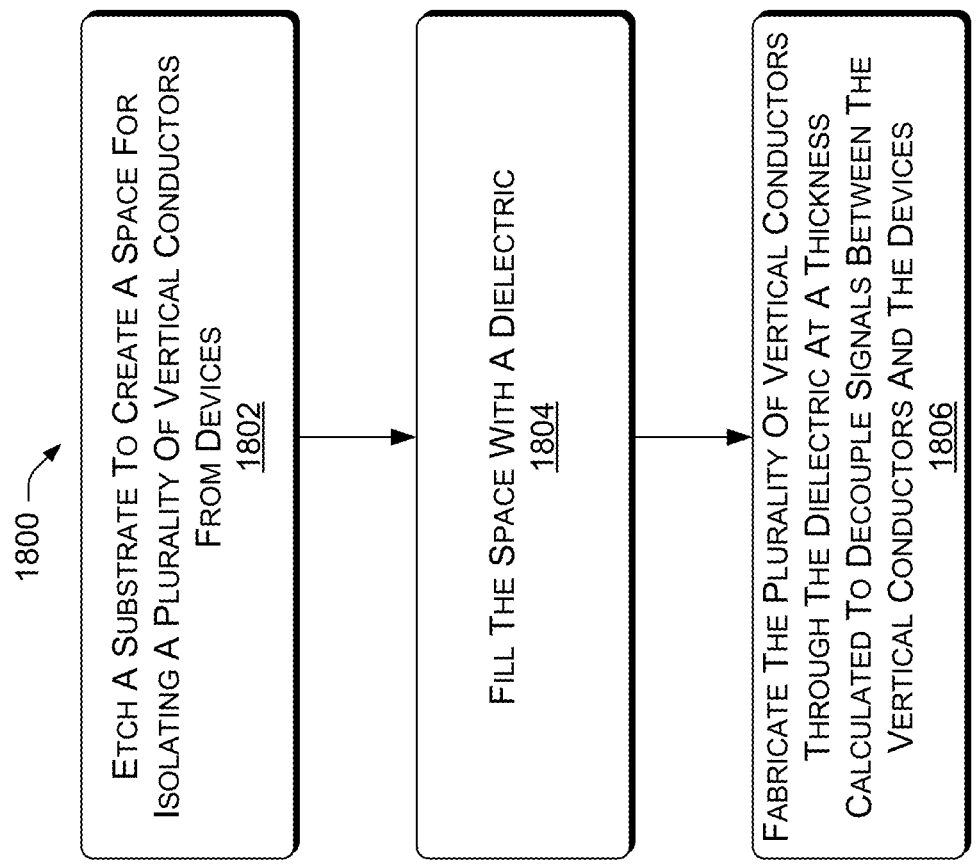
FIG. 18 is a flow diagram of another example method of fabricating through-dielectric-vias in a via middle process.

FIG. 18 shows another example method 1800 of fabricating through-dielectric-vias in a via middle process. In the flow diagram of FIG. 18, operations of the example method 1800 are shown in individual blocks.

At block 1802, in a via middle process, a silicon substrate is etched to create at least one space, each space for isolating a plurality of vertical conductors from devices of an integrated circuit.

At block 1804, the at least one space is filled with a dielectric.

At block 1806, the plurality of vertical conductors is fabricated through the dielectric, wherein a thickness of the dielectric is calculated to decouple signals between the vertical conductors and the devices.

In an implementation, filling the at least one space with the dielectric further includes forming an additional layer of the dielectric material over the at least one space, forming via holes or trenches in the additional layer for vertical conductors, and metalizing the via holes or trenches to extend the vertical conductors through the additional layer.

Figure 19:
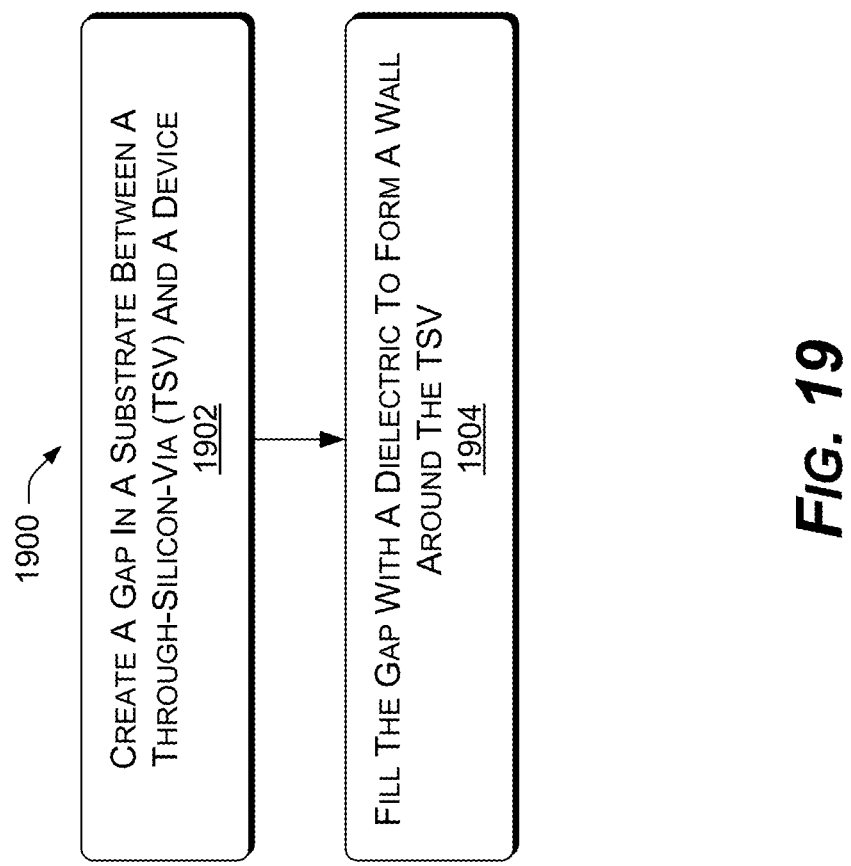
FIG. 19 is a flow diagram of an example via middle process of isolating through-silicon-vias (TSVs) in a dielectric to reduce signal coupling.

FIG. 19 shows an example via middle process 1900 of isolating through-silicon-vias (TSVs) in a dielectric. In the flow diagram of FIG. 19, operations of the example process 1900 are shown in individual blocks.

At block 1902, a gap is created in a substrate made of silicon between a through-silicon-via (TSV) in the silicon, and a device.

At block 1904, the gap is filled with a dielectric to form a dielectric column, a dielectric wall, or a dielectric cylinder around the through-silicon-via in silicon, the dielectric column, the dielectric wall, or the dielectric cylinder intervening between the through-silicon-via in silicon, and the device.

The gap may be created by patterning and etching the substrate. The gap filled with the dielectric can provide improved stress management and reduced keep-out-zones, reduced via-to-via coupling, reduced via-to-device coupling because of the relatively large dielectric spacing and low-k dielectrics that can be used, reduced losses of high frequency signals since metal-to-silicon diffusion and coupling is eliminated and parasitic capacitance is reduced, faster switching speeds, and lower heat dissipation requirements. These features can provide high performance stacked assemblies, and lower the cost of creating vias, while providing a via technology that is very scalable to large devices and interposers.

CONCLUSION

Although a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims.

The invention claimed is:

1. A method for fabricating a plurality of through-dielectric vias (TDVs) in a chip-to-wafer process, wherein the plurality of TDVs is formed through a dielectric block of an integrated circuits assembly, and the dielectric block is formed between adjacent devices of a substrate comprising a silicon wafer and a plurality of devices formed on the silicon wafer, the plurality of devices comprising the adjacent devices, the method comprising:

(a) removing a section of the silicon wafer disposed between the adjacent devices, wherein:
  the section is removed from a first side of the substrate to a depth that extends to an opposite second side of the substrate;
  a plurality of chips is attached to the second side; and
  one or more of the plurality of chips are communicatively coupled to one or more devices of the plurality of devices through a back-end-of-line (BEOL) distribution layer disposed between the second side and the plurality of chips;
(b) after (a), depositing a dielectric material on the first side of the substrate and planarizing the dielectric material to form a dielectric layer, wherein:
  a first portion of the dielectric layer comprises the dielectric block and second portions of the dielectric layer are disposed over each of the plurality of devices; and
  the dielectric block fills a space formed by removing the section at (a);
(c) forming a plurality of via holes through the dielectric block, wherein the plurality of via holes extend from the first side to the second side of the substrate; and
(d) metalizing the plurality of via holes to form the plurality of TDVs.

2. The method of claim 1, wherein each of the plurality of TDVs are approximately 1-10 µm in diameter and approximately 100-150 µm in height.

3. The method of claim 1, wherein the dielectric material used to form the dielectric block is selected from a group consisting of an epoxy, a glass epoxy, a glass, a flowable insulator, a low-k dielectric, a porous dielectric, a dielectric polymer, a silicon oxide, a fluorine-doped silicon dioxide, a fluorosilicate glass, a fluorinated silica glass, a carbon-doped silicon dioxide, a porous silicon dioxide, a porous carbon-doped silicon dioxide, a spin-on organic polymeric dielectric, a polyimide, a polynorbornene, a benzocyclobutene, a polytetrafluoroethylene (PTFE), a spin-on silicon-based polymeric dielectric, a hydrogen silsesquioxane (HSQ), a methylsilsesquioxane (MSQ), and combinations thereof.

4. The method of claim 1, wherein the integrated circuit assembly comprises one or more of the adjacent devices and one or more of the plurality of chips, wherein a volume of the section removed at (a) and an amount of material used to form the dielectric block at (b) are determined such that a result is provided, wherein the result is selected from a group consisting of reducing a parasitic capacitance induced by a device of the integrated circuit assembly, increasing a switching speed of the integrated circuit assembly, reducing a heat dissipation requirement of the integrated circuit assembly, reducing a size of a keep-out-zone of the integrated circuit assembly, increasing a signal decoupling between a TDV of the plurality of TDVs and a device of the integrated circuit assembly, reducing a signal coupling between two or more of the TDVs of the plurality of TDVs, relieving a tensile stress around a TDV of the plurality of TDVs, preventing a lateral signal leakage of the integrated circuit assembly, and reducing a carrier mobility variation of the silicon caused by a tensile stress near a TDV of the plurality of TDVs.

5. The method of claim 1, wherein the substrate comprises a silicon-on-insulator (SOI) structure or a lateral insulator.

6. The method of claim 4, wherein the dielectric block includes an air space or a void filled with air.

7. The method of claim 1, wherein the plurality of chips is disposed in an encapsulant material.

8. The method of claim 1, wherein the plurality of TDVs have a pitch of about 20 µm or about 50 µm.

9. The method of claim 1, wherein the plurality of TDVs have a reduced insertion loss of signal power over signal frequencies between 0.1 GHz and 10.0 GHz when compared to through-silicon vias formed with the same pitch.

10. The method of claim 1, wherein (a) comprises:
  forming a patterned resist layer on the first side of the substrate, wherein adjacent portions of the patterned resist layer are respectively disposed over the adjacent devices; and
  etching the substrate through a gap disposed between the adjacent portions of the patterned resist layer.

11. A method for fabricating a plurality of through-dielectric vias (TDVs) in a wafer-to-wafer process, wherein the plurality of TDVs is disposed through a dielectric block of an integrated circuit assembly, and the dielectric block is formed between adjacent devices of a first substrate comprising a silicon wafer and a plurality of first devices formed on the silicon wafer, the method comprising:
(a) removing a section of the silicon wafer disposed between the adjacent devices, wherein the section is removed from a first side of the first substrate to a depth that extends to a second side of the first substrate opposite the first side, a second substrate is bonded to the second side of the first substrate, the second substrate comprising a plurality of second devices, and one or more of the plurality of first devices are communicatively coupled to one or more of the plurality of second devices through one or more back-end-of-line (BEOL) distribution layers disposed between the first and second substrates;
(b) after (a), depositing one or more dielectric materials on the first side of the first substrate and planarizing a surface of the one or more dielectric materials to form a dielectric layer, wherein:
  a first portion of the dielectric layer comprises the dielectric block and second portions of the dielectric layer are disposed over each of the plurality of first devices; and
  the dielectric block fills a space formed by removing the section at (a);
(c) forming a plurality of via holes through the dielectric block, wherein the plurality of via holes extend from the first side of the first substrate to the second side of the first substrate; and
(d) metalizing the plurality of via holes to form the plurality of TDVs, wherein each of the plurality of TDVs are electrically connected to the one or more BEOL distribution layers.

12. The method of claim 11, further comprising:
(e) forming a multi-layered interconnect structure on the first side of the first substrate, wherein the plurality of TDVs electrically connect the multi-layered interconnect structure to the one or more BEOL layers.

13. The method of claim 11, further comprising creating multiple instances of a microelectronic assembly, each comprising one or more first devices bonded to one or more second devices and the plurality of TDVs, as layers to fabricate a 3D integrated circuit stack.

14. The method of claim 11, wherein each of the plurality of TDVs are approximately 1-10 µm in diameter and approximately 100-150 µm in height.

15. The method of claim 11, wherein the one or more dielectric materials used to form the dielectric block is selected from a group consisting of an epoxy, a glass epoxy, a glass, a flowable insulator, a low-k dielectric, a porous dielectric, a dielectric polymer, a silicon oxide, a fluorine-doped silicon dioxide, a fluorosilicate glass, a fluorinated silica glass, a carbon-doped silicon dioxide, a porous silicon dioxide, a porous carbon-doped silicon dioxide, a spin-on organic polymeric dielectric, a polyimide, a polynorbornene, a benzocyclobutene, a polytetrafluoroethylene (PTFE), a spin-on silicon-based polymeric dielectric, a hydrogen silsesquioxane (HSQ), and a methylsilsesquioxane (MSQ), and combinations thereof.

16. The method of claim 11, wherein a volume of the section of silicon removed at (a) and an amount of the one or more dielectric materials used to form the dielectric block at (b) are determined such that a result is provided, wherein the result is selected from a group consisting of reducing a parasitic capacitance induced by a portion of the integrated circuit assembly, increasing a switching speed of the integrated circuit assembly, reducing a heat dissipation requirement of the integrated circuit assembly, reducing a size of a keep-out-zone of the integrated circuit assembly, increasing a signal decoupling between a TDV of the plurality of TDVs and the portion of the integrated circuit assembly, reducing a signal coupling between two or more of the TDVs of the plurality of TDVs, relieving a tensile stress around a TDV of the plurality of TDVs, preventing a lateral signal leakage of the integrated circuit assembly, and reducing a carrier mobility variation of the silicon caused by a tensile stress near a TDV of the plurality of TDVs.

17. The method of claim 11, wherein the first substrate comprises a silicon-on-insulator (SOI) structure or a lateral insulator.

18. The method of claim 11, wherein the plurality of TDVs have a pitch of about 20 μm or about 50 μm.

19. The method of claim 11, wherein the plurality of TDVs have a reduced insertion loss of signal power over signal frequencies between 0.1 GHz and 10.0 GHz when compared to through-silicon vias formed with a same pitch as the plurality of TDVs.

20. The method of claim 11, wherein (a) comprises:
forming a patterned resist layer on the first side of the first substrate, wherein adjacent portions of the patterned resist layer are respectively disposed over the adjacent devices; and
etching the first substrate through a gap disposed between the adjacent portions of the patterned resist layer.

21. A method for fabricating a plurality of through-dielectric vias (TDVs) in a dielectric block of an integrated circuit assembly, wherein the dielectric block is formed between adjacent devices of a first substrate comprising a plurality of first devices formed on a silicon wafer, and one or more of the plurality of first devices are communicatively coupled to one or more of a plurality of second devices through at least one back-end-of-line (BEOL) distribution layer disposed therebetween, the method comprising:
(a) removing a section of the silicon wafer disposed between the adjacent devices, wherein the section is removed from a first side of the first substrate to a depth that extends to a second side, the second side is opposite the first side, and the plurality of second devices are attached to the second side of the first substrate;
(b) after (a), forming the dielectric block between the adjacent devices, wherein the dielectric block fills a space formed by removing the section at (a), and forming the dielectric block comprises:
(i) depositing one or more dielectric materials on the first side of the first substrate; and
(ii) planarizing a surface of the one or more dielectric materials to form a dielectric layer, wherein a first portion of the dielectric layer comprises the dielectric block and second portions of the dielectric layer are disposed over each of the plurality of first devices so that the first and second portions encapsulate each of the plurality of first devices;
(c) forming a plurality of via holes through the dielectric block, wherein the plurality of via holes extend from the first side of the first substrate to the second side; and
(d) metalizing the via holes to form a plurality of TDVs, wherein each of the plurality of TDVs are electrically connected to the at least one BEOL distribution layer.

22. The method of claim 21, wherein the silicon wafer has a thickness between 2 and 25 μm.

* * * * *